(12) United States Patent
Choi et al.

(10) Patent No.: US 8,168,977 B2
(45) Date of Patent: May 1, 2012

(54) LIQUID CRYSTAL DISPLAY AND METHOD FOR MANUFACTURING THE SAME

(75) Inventors: Tae-Young Choi, Seoul (KR); Bo-Sung Kim, Seoul (KR); Young-Min Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 334 days.

(21) Appl. No.: 12/622,078

(22) Filed: Nov. 19, 2009

(65) Prior Publication Data
US 2010/0270553 A1    Oct. 28, 2010

(30) Foreign Application Priority Data
Apr. 22, 2009   (KR) .................. 10-2009-0035163

(51) Int. Cl.
*H01L 29/04* (2006.01)

(52) U.S. Cl. ............ 257/59; 257/72; 257/258; 257/290; 257/E31.053

(58) Field of Classification Search .................... 257/59, 257/72, 258, 290
See application file for complete search history.

(56) References Cited

U.S. PATENT DOCUMENTS

| | | | |
|---|---|---|---|
| 6,909,477 B1 | 6/2005 | Yi et al. | |
| 2002/0182766 A1* | 12/2002 | Yamamoto | 438/30 |
| 2003/0013236 A1* | 1/2003 | Nakata et al. | 438/149 |
| 2004/0109108 A1 | 6/2004 | Lee et al. | |
| 2005/0078252 A1* | 4/2005 | Lin | 349/139 |
| 2007/0023837 A1 | 2/2007 | Lee et al. | |
| 2008/0241990 A1 | 10/2008 | Kim et al. | |

FOREIGN PATENT DOCUMENTS

| | | |
|---|---|---|
| JP | 2000-098368 | 4/2000 |
| JP | 2004-246289 | 9/2004 |
| JP | 2007-036259 | 2/2007 |
| KR | 100397671 | 8/2003 |
| KR | 100565738 | 3/2006 |
| KR | 2007-0013888 | 1/2007 |
| KR | 2007-0082090 | 8/2007 |
| KR | 2007-0103945 | 10/2007 |
| KR | 2008-0030155 | 4/2008 |
| KR | 2008-0088251 | 10/2008 |

* cited by examiner

*Primary Examiner* — Wai Sing Louie
(74) *Attorney, Agent, or Firm* — H.C. Park & Associates, PLC

(57) ABSTRACT

The present invention provides a thin film transistor having high performance in a liquid crystal display, and a manufacturing method of a liquid crystal display according to an exemplary embodiment of the present invention that includes: forming a gate line including a gate electrode on a substrate; forming a gate insulating layer on the gate line; forming a data line including a source electrode and a drain electrode facing the source electrode on the gate insulating layer; forming a partition defining a pixel area and having an opening region exposing the gate insulating layer on the gate electrode, the source electrode and the drain electrode on the gate line, and the data line and the drain electrode; forming a semiconductor in the opening region; forming a color filter in the pixel area defined by the partition; and forming a pixel electrode connected to the drain electrode on the color filter.

10 Claims, 6 Drawing Sheets

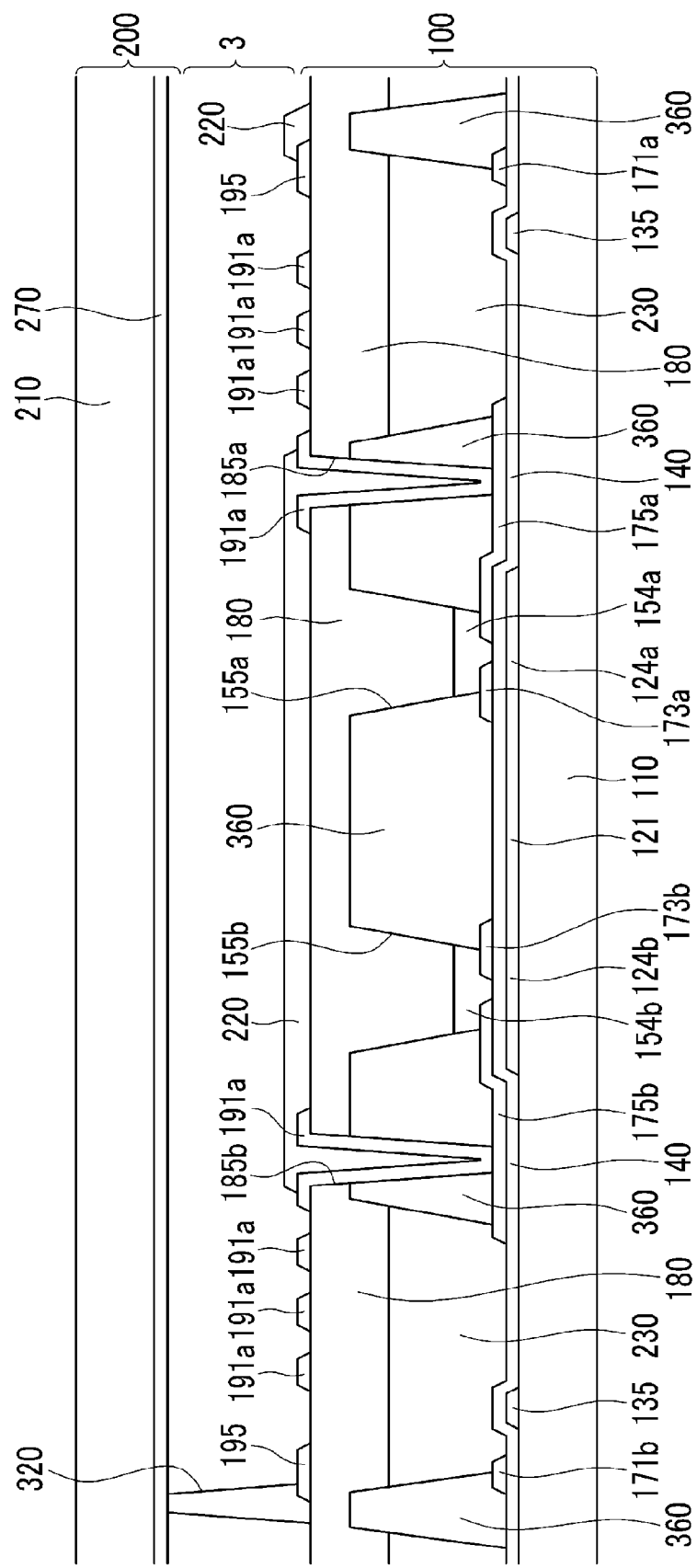

LIQUID CRYSTAL DISPLAY AND METHOD FOR MANUFACTURING THE SAME

CROSS REFERENCE TO RELATED APPLICATION

This application claims priority from and the benefit of Korean Patent Application No. 10-2009-0035163 filed on Apr. 22, 2009, which is hereby incorporated by reference for all purposes as if fully set forth herein.

BACKGROUND OF THE INVENTION

1. Field of the Invention

Exemplary embodiments of the present invention relate to a liquid crystal display.

2. Discussion of the Background

A liquid crystal display (LCD) is one type of commonly used flat panel display. The LCD includes two substrates with electrodes formed thereon and a liquid crystal layer is disposed between the two substrates. In the LCD, a voltage is applied to the electrodes to realign is liquid crystal molecules of the liquid crystal layer to thereby regulate the transmittance of light passing through the liquid crystal layer.

In the LCD, a thin film transistor is used as a switching element for independently driving a pixel. The thin film transistor includes a gate electrode connected to a gate line, a source electrode connected to a data line, a drain electrode connected to a pixel electrode, and a semiconductor layer on the gate electrode between the source electrode and the drain electrode. A channel of the thin film transistor is formed in the semiconductor layer between the source electrode and the drain electrode.

High performance thin film transistors are used with an ultra high definition LCD.

An oxide semiconductor may be used as the semiconductor layer of the high performance thin film transistor. However, it is difficult to apply conventional manufacturing processes to the oxide semiconductor in such applications with satisfactory results.

The above information disclosed in this Background section is only for enhancement of understanding of the background of the invention and therefore it may contain information that does not form any part of the prior art.

SUMMARY OF THE INVENTION

Exemplary embodiments of the present invention provide a thin film transistor having high performance.

Exemplary embodiments of the present invention also provide a semiconductor layer formed by an inkjet method in the thin film transistor having high performance.

Exemplary embodiments of the present invention also provide a manufacturing method of a liquid crystal display including a thin film transistor having high performance.

Additional features of the invention will be set forth in the description which follows, and in part will be apparent from the description, or may be learned by practice of the invention.

An exemplary embodiment of the present invention discloses a manufacturing method of a liquid crystal display including the following forming operations. Forming a gate line including a gate electrode on a substrate. Forming a gate insulating layer on the gate line. Forming a data line including a source electrode and a drain electrode facing the source electrode on the gate insulating layer. Forming a partition on the gate electrode and the data line, and having an opening region exposing the gate insulating layer on the gate electrode. Forming a semiconductor in the opening region. Forming a color filter in the pixel area defined by the partition; and forming a pixel electrode connected to the drain electrode on the color filter.

An exemplary embodiment of the present invention also discloses a liquid crystal display including the following. A substrate and a gate line formed on the substrate and including a gate electrode. A gate insulating layer disposed on the gate line. A data line disposed on the gate insulating layer and including a source electrode, and a drain electrode facing the source electrode. A partition disposed on a portion corresponding to the gate line, the data line, and the drain electrode on the gate insulating layer, defining a pixel area, and having an opening region exposing the gate insulating layer, the source electrode, and the drain electrode on the gate electrode. A semiconductor layer disposed in the opening region. A color filter disposed in the pixel area defined by the partition; and a pixel electrode disposed on the color filter and electrically connected to the drain electrode.

It is to be understood that both the foregoing general description and the following detailed description are exemplary and explanatory and are intended to provide further is explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 9 is a cross-sectional view taken along line IX-IX shown in FIG. 8.

DETAILED DESCRIPTION OF THE ILLUSTRATED EMBODIMENTS

Figure 1:
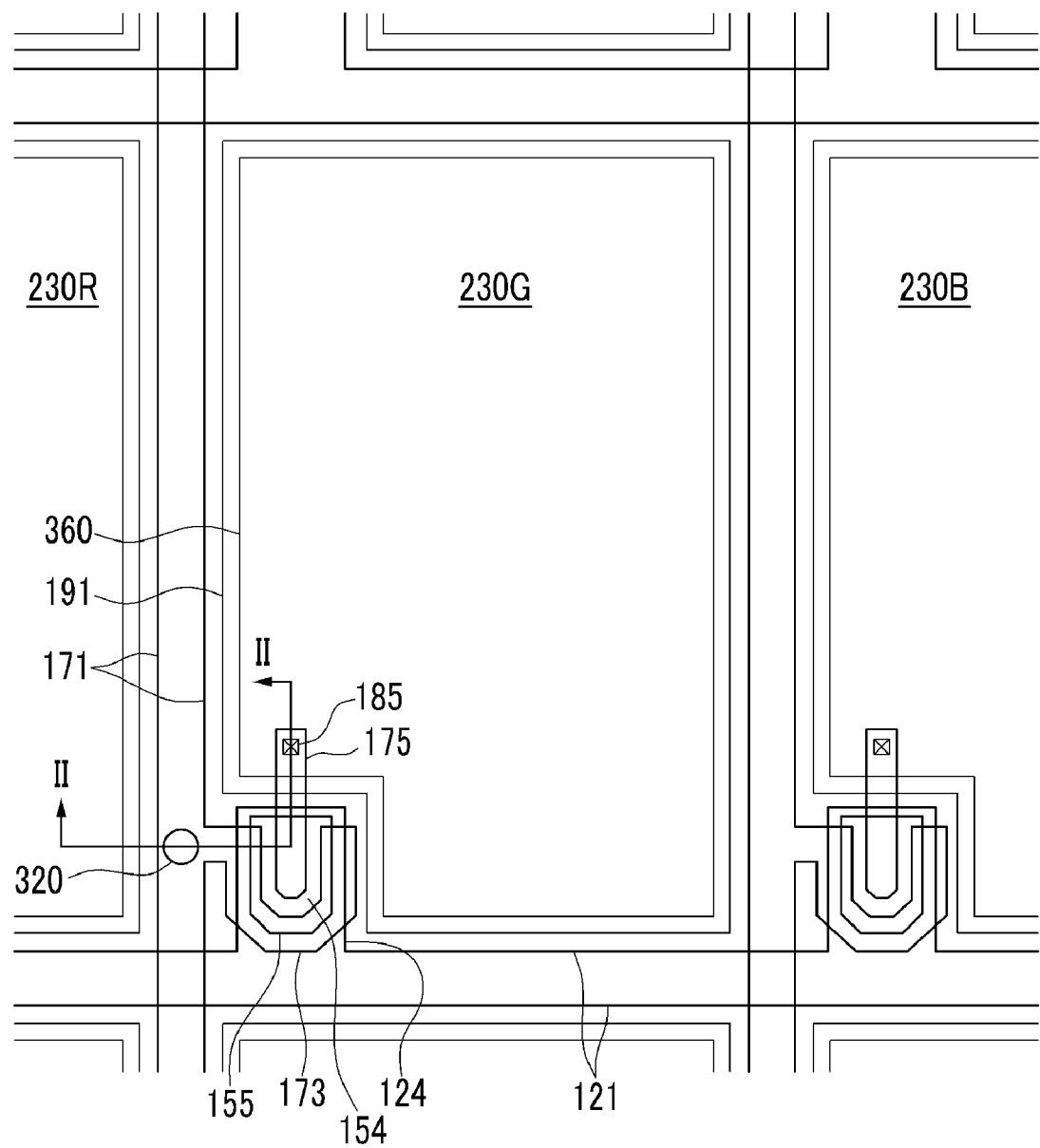
FIG. 1 is a layout view of a liquid crystal display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region, or substrate is referred to as being "on" or "connected to" another element, it can be directly on or directly connected to the other element or intervening elements may also be present. In contrast, when an element is referred to as being "directly on" or "directly connected to" another element, there are no intervening elements present.

Figure 2:
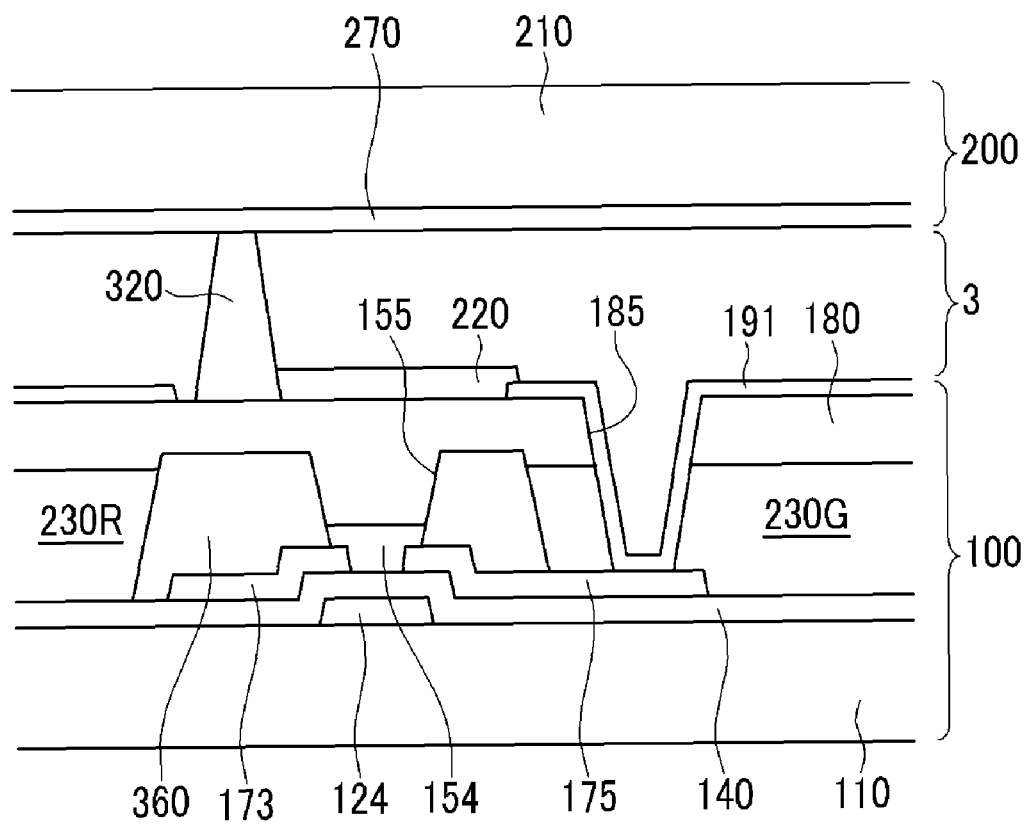
FIG. 2 is a cross-sectional view taken along line II-II shown in FIG. 1.

FIG. 1 is a layout view of a liquid crystal display according to an exemplary embodiment of the present invention, and FIG. 2 is a cross-sectional view taken along line II-II shown in FIG. 1.

As shown in FIG. 1 and FIG. 2, a liquid crystal display according to an exemplary embodiment of the present invention includes a lower panel 100 and an upper panel 200 facing each other, and a liquid crystal layer 3 disposed between the two display panels 100 and 200.

Firstly, the lower panel 100 will be described.

A plurality of gate lines 121 including gate electrodes 124, a gate insulating layer 140, and a plurality of data lines 171 and a plurality of drain electrodes 175 are sequentially formed on a substrate 110 made of an insulating material such as glass or plastic.

The gate lines 121 transmit gate signals and mainly extend in a transverse direction.

The data lines 171 transmit data signals and mainly extend in a longitudinal direction, thereby crossing the gate lines 121. Each data line 171 includes a plurality of source electrodes 173 extending toward the gate electrodes 124. The drain electrodes 175 are separated from the data lines 171 and are opposite to the source electrodes 173 with respect to the gate electrodes 124.

A partition 360 is formed on the gate lines 121, the data lines 171, and the drain electrodes 175. The partition 360 includes an opening region 155 exposing the gate insulating layer 140 on the gate electrodes 124, and the semiconductor 154 is formed in the opening region 155.

The semiconductor 154 contacts a portion of the source electrode 173 and the drain electrode 175, and forms a thin film transistor (TFT) along with the gate electrode 124, the source electrode 173, and the drain electrode 175, and a channel of the thin film transistor is formed in the semiconductor 154 between the source electrode 173 and the drain electrode 175.

Color filters 230R, 230G, and 230B are formed in pixel areas defined by the partition 360.

A passivation layer 180 is formed on the color filters 230R, 230G, and 230B. The passivation layer 180 and the color filters 230R, 230G, and 230B have contact holes 185 exposing the drain electrodes 175. The contact holes 185 may be formed in the passivation layer 180 and the partition 360. Also, the passivation layer 180 may be omitted if necessary.

A pixel electrode 191 is formed on the passivation layer 180 and connected to the drain electrode 175 through the contact hole 185.

A light blocking member 220 having a portion corresponding to the gate lines 121 and the data lines 171 is formed on the passivation layer 180, and a spacer 320 is formed to maintain the interval between the lower panel 100 and the upper panel 200.

The upper panel 200 faces the lower panel 100, and includes a substrate 210 and a common electrode 270 formed thereon. However, the common electrode 270 may be formed on the lower panel 100.

A liquid crystal layer 3 is formed between the upper panel 200 and the lower panel 100.

Next, a manufacturing method of the liquid crystal display shown in FIG. 1 and FIG. 2 will be described with reference to FIG. 3, FIG. 4, FIG. 5, FIG. 6 and FIG. 7 as well as FIG. 1 and FIG. 2.

Figure 3:
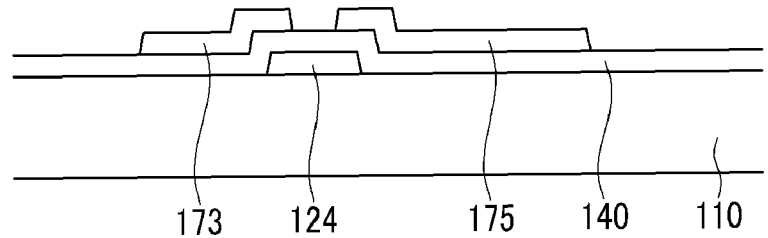
FIG. 3, FIG. 4, FIG. 5, FIG. 6 and FIG. 7 are cross-sectional views sequentially showing a manufacturing method of a liquid crystal display according to an exemplary embodiment of the present invention.

Firstly, as shown in FIG. 3, a gate line 121 including a gate electrode 124, a gate insulating layer 140, a data line 171 including a source electrode 173, and a drain electrode 175 are sequentially formed on an insulation substrate 110.

Figure 4:
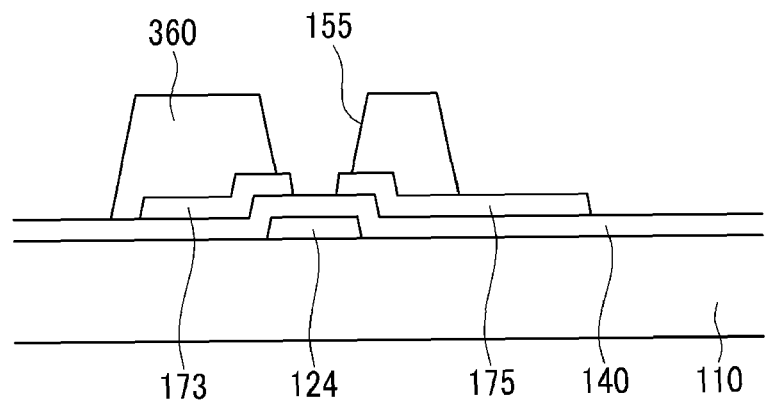

Next, as shown in FIG. 4, a partition 360 is formed on the gate line 121, the data line 171, and the drain electrode 175. The partition 360 may be made of a transparent organic material, and has an opening region 155 exposing the gate insulating layer 140 on the gate electrode 124. The opening region 155 exposes portions of the source electrode 173 and the drain electrode 175. The partition 360 may have a contact hole exposing the drain electrode 175.

Figure 5:
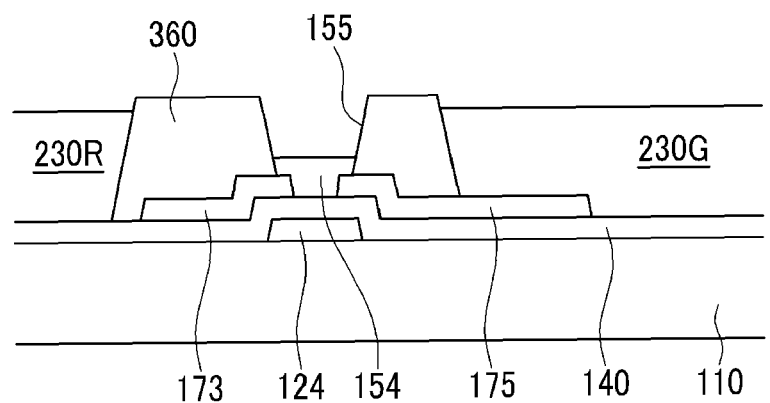

Next, as shown in FIG. 5, a semiconductor 154 is formed in the opening region 155 by an inkjet method. The semiconductor 154 may be made of an oxide semiconductor or of silicon. The semiconductor 154 contacts portions of the source electrode 173 and the drain electrode 175. Color filters 230R, 230G, and 230B are formed in the pixel area defined by the partition 360 through the inkjet method.

In an exemplary embodiment of the present invention, the color filters 230R, 230G, and 230B are formed after forming the semiconductor 154, however the semiconductor 154 may be formed after forming the color filters 230R, 230G, and 230B.

Figure 6:
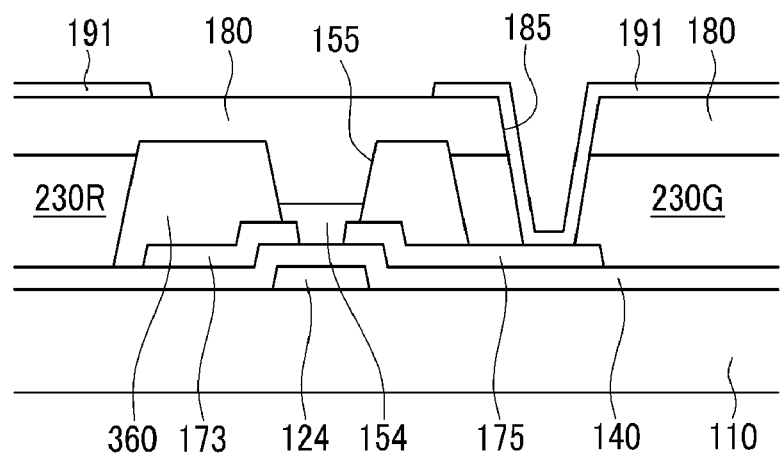

Next, as shown in FIG. 6, a passivation layer 180 is formed on the color filters 230R, 230G, and 230B, and the partition 360. The passivation layer 180 and the color filters 230R, 230G, and 230B are patterned to form a contact hole 185 exposing the drain electrode 175, and then a pixel electrode 191, which is connected to the drain electrode 175, is formed on the passivation layer 180.

Figure 7:
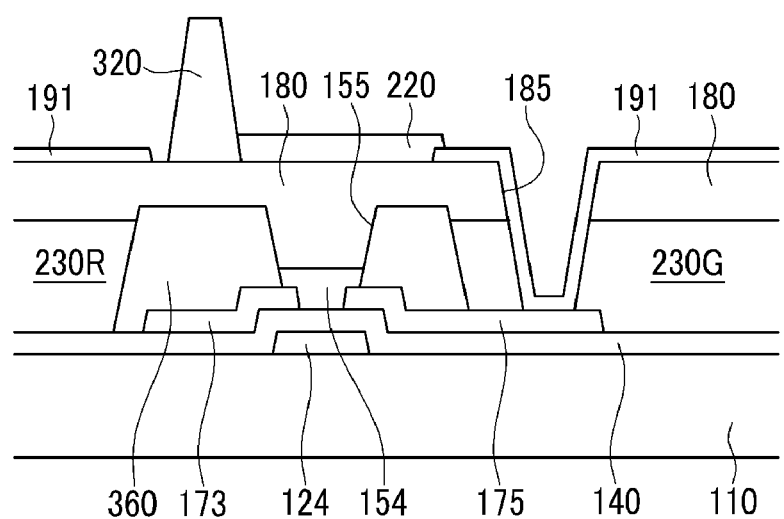

Next, as shown in FIG. 7, a light blocking member 220 and a spacer 320 are formed on the gate line 121 and the data line 171. After forming the passivation layer 180 and the pixel electrode 191, the light blocking member 220 and the spacer 320 may be formed together through an exposure and a developing process using a slit mask.

Next, as shown in FIG. 2, regarding the upper panel 200, after forming a common electrode 270 on an insulation substrate 210, liquid crystal is dripped on one of the lower panel 100 and the upper panel 200, and then the two display panels 100 and 200 are assembled.

Figure 8:
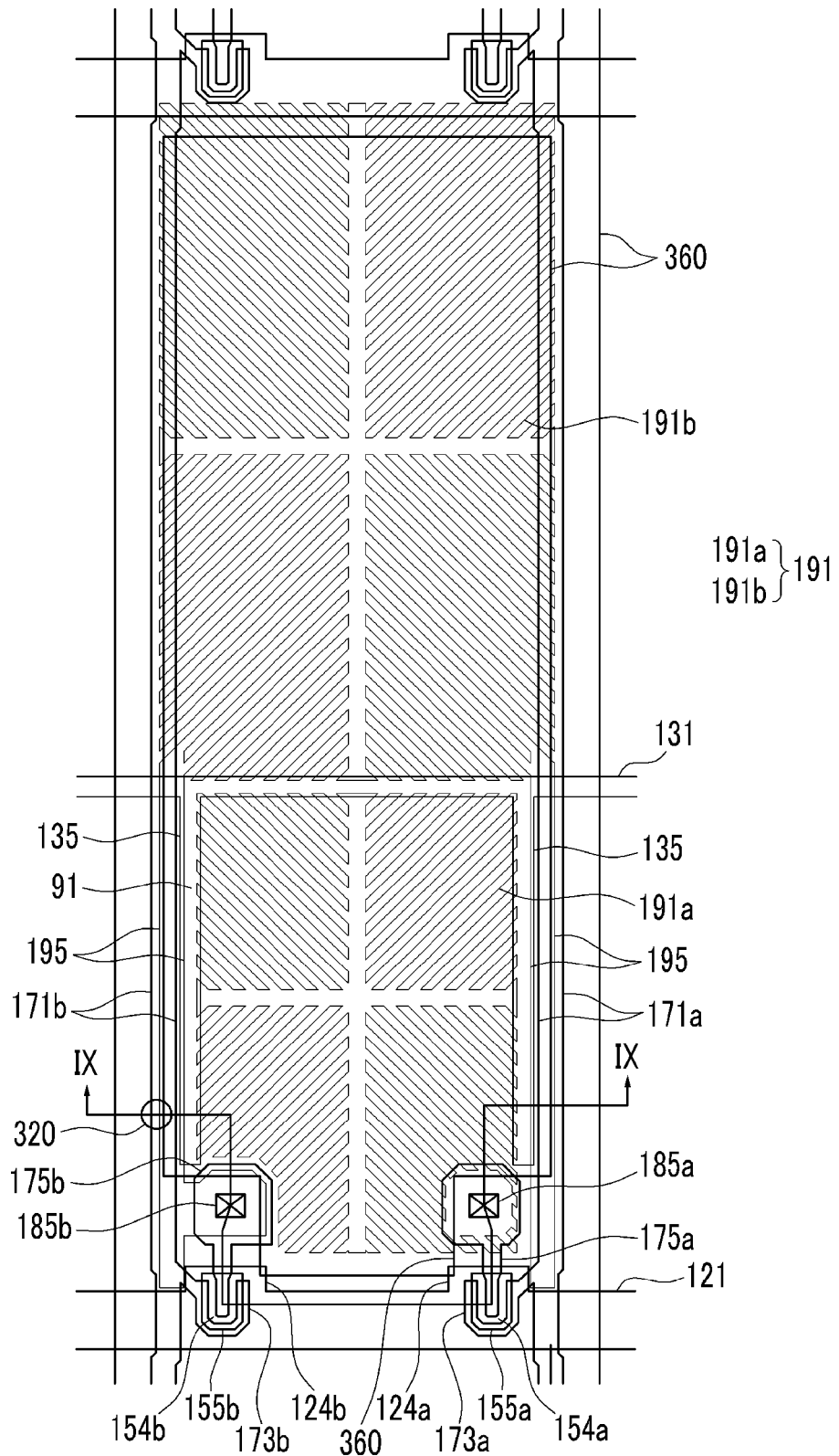
FIG. 8 is a layout view of a liquid crystal display according to another exemplary embodiment of the present invention.

FIG. 8 is a layout view of a liquid crystal display according to another exemplary embodiment of the present invention, and FIG. 9 is a cross-sectional view taken along line IX-IX shown in FIG. 8.

As shown in FIG. 8 and FIG. 9, a liquid crystal display according to another exemplary embodiment of the present invention includes a lower panel 100 and an upper panel 200 facing each other, and a liquid crystal layer 3 interposed between the two display panels 100 and 200.

Firstly, the lower panel 100 will be described.

A plurality of gate lines 121 and a plurality of storage electrode lines 131 and 135 are formed on an insulation substrate 110. The gate lines 121 transmit gate signals and mainly extend in a transverse direction. Each gate line 121 includes a plurality of first gate electrodes 124a and second gate electrodes 124b protruding upward. The storage electrode lines 131 and 135 include a stem 131 substantially parallel to the gate lines 121 and a plurality of storage electrodes 135 extended therefrom. The shape and arrangement of the storage electrode lines 131 and 135 may be variously changed.

A gate insulating layer 140 is formed on the gate lines 121 and the storage electrode lines 131 and 135. A plurality of pairs of data lines 171a and 171b and a plurality of first drain electrodes 175a and second drain electrodes 175b are formed on the gate insulating layer 140.

The data lines 171a and 171b transmit data signals and extend in the longitudinal direction, thereby crossing the gate lines 121 and the stems 131 of the storage electrode lines. The data lines 171a and 171b include first source electrodes 173a and second source electrodes 173b, respectively, curved with a "U" shape and extending toward the first gate electrodes 124a and the second gate electrodes 124b, respectively. The first source electrodes 173a and the second source electrodes 173b face the first drain electrodes 175a and the second drain electrodes 175b with respect to the first gate electrodes 124a and the second gate electrodes 124b, respectively.

Each first drain electrode 175a starts from one end enclosed by the corresponding first source electrode 173a and is extended upward, and the other end thereof may have a wide area for connection to another layer. However, the shapes and arrangements of the first drain electrodes 175a, the second drain electrodes 175b and the data lines 171a and 171b may be modified in various forms.

A partition 360 is formed on the gate lines 121, the data lines 171a and 171b, the first drain electrodes 175a and the second drain electrodes 175b. The partition 360 may be made of the transparent organic material, and has first opening regions 155a and second opening regions 155b exposing the gate insulating layer 140 on the first gate electrodes 124a and the second gate electrodes 124b, respectively.

First semiconductors 154a and second semiconductors 154b are formed in the opening regions 155a and 155b. The first semiconductors 154a and the second semiconductors 154b respectively contact portions of the first source electrodes 173a and the second source electrodes 173b and the first drain electrodes 175a and the second drain electrodes 175b. The first semiconductors 154a and the second semiconductors 154b respectively form first thin film transistors (TFTs) and second thin film transistors along with the first gate electrodes 124a and the second gate electrodes 124b, the first source electrodes 173a and the second source electrodes 173b, and the first drain electrodes 175a and the second drain electrodes 175b. The channels of the first thin film transistors and the second thin film transistors are respectively formed in the first semiconductors 154a and the second semiconductors 154b between the first source electrodes 173a and the second source electrodes 173b and the first drain electrodes 175a and the second drain electrodes 175b.

A color filter 230 is formed in the pixel area defined by the partition 360, and a passivation layer 180 is formed on the partition 360 and the color filter 230.

The passivation layer 180 and the partition 360 have a plurality of first contact holes 185a and second contact holes 185b exposing the first drain electrodes 175a and the second drain electrodes 175b, respectively. The contact holes 185a and 185b may be formed in the passivation layer 180 and the color filter 230. Also, the passivation layer 180 may be omitted if necessary.

A plurality of pixel electrodes 191 are formed on the passivation layer 180, and each pixel electrode 191 includes a first sub-pixel electrode 191a and a second sub-pixel electrode 191b that are separated from each other via a gap 91.

The area occupied by the second sub-pixel electrode 191b may be larger than the area occupied by the first sub-pixel electrode 191a in the whole pixel electrode 191, and the area of the second sub-pixel electrode 191b may be 1.0 to 2.2 times the area of the first sub-pixel electrode 191a.

The second sub-pixel electrode 191b includes a pair of branches 195 extending according to the data lines 171a and 171b. The branches 195 are disposed between the first sub-pixel electrode 191b and the respective data line 171a and 171b, and are connected on the lower portion of the first sub-pixel electrode 191b. One branch 195 of the pair is extended and is physically and electrically connected to the corresponding second drain electrode 175b through the associated second contact hole 185b. Also, the first sub-pixel electrode 191a is connected to the corresponding first drain electrode 175a through the associated first contact hole 185a.

The first sub-pixel electrode 191a and the second sub-pixel electrode 191b receive data voltages from the first drain electrode 175a and the second drain electrode 175b, respectively.

A light blocking member 220 including portions corresponding to the gate lines 121, the data lines 171a and 171b, and the first thin film transistors and the second thin film transistors is formed on the passivation layer 180, and a spacer 320 is formed for maintaining the interval between the lower panel 100 and the upper panel 200.

Next, the upper panel 200 will be described.

The upper panel 200 includes a common electrode 270 formed on the whole surface of a transparent insulation substrate 210. However, the common electrode 270 may be formed on the lower panel 100.

A liquid crystal layer 3 is formed between the upper panel 200 and the lower panel 100.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a substrate;
   a gate line disposed on the substrate and comprising a gate electrode;
   a gate insulating layer disposed on the gate line;
   a data line disposed on the gate insulating layer and comprising a source electrode;
   a drain electrode facing the source electrode;
   a partition disposed on a portion corresponding to the gate line, the data line, and the drain electrode, the partition defining a pixel area and having an opening region exposing the gate insulating layer, the source electrode, and the drain electrode;
   a semiconductor layer disposed in the opening region;
   a color filter disposed in the pixel area defined by the partition; and a pixel electrode disposed on the color filter and electrically connected to the drain electrode.

2. The liquid crystal display of claim 1, further comprising a passivation layer disposed on the partition and the color filter and under the pixel electrode.

3. The liquid crystal display of claim 2, wherein the semiconductor layer comprises an oxide semiconductor.

4. The liquid crystal display of claim 3, wherein the semiconductor layer contacts portions of the source electrode and the drain electrode.

5. The liquid crystal display of claim 4, wherein the color filter and the passivation layer have a contact hole exposing the drain electrode, and the pixel electrode is connected to the drain electrode through the contact hole.

6. The liquid crystal display of claim 4, wherein the partition and the passivation layer have a contact hole exposing the drain electrode, and the pixel electrode is connected to the drain electrode through the contact hole.

7. The liquid crystal display of claim 4, further comprising a light blocking member disposed on the passivation layer, the light blocking member comprising portions corresponding to the gate line and the data line.

8. The liquid crystal display of claim 7, further comprising a spacer disposed on the passivation layer.

9. The liquid crystal display of claim 1, further comprising a light blocking member disposed on the passivation layer, the light blocking member comprising portions corresponding to the gate line and the data line.

10. The liquid crystal display of claim 1, further comprising a spacer disposed on the partition.

* * * * *